(12) United States Patent
Sinha et al.

(10) Patent No.: US 9,634,561 B1
(45) Date of Patent: Apr. 25, 2017

(54) PROGRAMMABLE CHARGE PUMP

(71) Applicant: FREESCALE SEMICONDUCTOR, INC., Austin, TX (US)

(72) Inventors: Anand Kumar Sinha, Noida (IN); Firas N. Abughazaleh, Austin, TX (US); Devesh P. Singh, Bijnor (IN); Sanjay K. Wadhwa, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/990,752

(22) Filed: Jan. 7, 2016

(51) Int. Cl.
*G05F 1/10* (2006.01)
*G05F 3/02* (2006.01)
*H02M 3/07* (2006.01)
*H03K 17/687* (2006.01)

(52) U.S. Cl.
CPC .......... *H02M 3/07* (2013.01); *H03K 17/6871* (2013.01)

(58) Field of Classification Search
CPC ..................................................... H02M 3/07
USPC ........................................................ 327/536
See application file for complete search history.

(56) References Cited

U.S. PATENT DOCUMENTS

| | | | |
|---|---|---|---|
| 3,723,895 A | 3/1973 | Peil | |
| 5,508,660 A | 4/1996 | Gersbach et al. | |
| 6,657,477 B2 | 12/2003 | Hughes | |
| 6,784,707 B2 | 8/2004 | Kim et al. | |
| 6,856,180 B1 | 2/2005 | Starr | |
| 6,894,569 B2 | 5/2005 | Fayneh et al. | |
| 7,176,733 B2 | 2/2007 | Haerle | |
| 7,253,686 B2 | 8/2007 | Ali | |
| 7,385,429 B1 | 6/2008 | Mei | |
| 7,408,391 B2 | 8/2008 | Haerle | |
| 7,466,252 B1* | 12/2008 | Radulov | H03M 1/1061 341/120 |
| 7,528,648 B2 | 5/2009 | Raimar | |
| 7,570,105 B1 | 8/2009 | Baek | |
| 7,616,035 B2 | 11/2009 | Haerle | |
| 7,688,122 B2 | 3/2010 | Nedovic | |
| 7,701,270 B2 | 4/2010 | Wyatt et al. | |
| 7,705,640 B2 | 4/2010 | Clements et al. | |
| 7,965,117 B2* | 6/2011 | Wadhwa | H03L 7/0896 327/148 |
| 8,063,678 B2 | 11/2011 | Wadhwa et al. | |
| 2002/0163380 A1 | 11/2002 | Hughes | |
| 2004/0008063 A1 | 1/2004 | Kim et al. | |
| 2004/0066220 A1 | 4/2004 | Chen | |
| 2007/0080729 A1 | 4/2007 | Haerle | |
| 2007/0164811 A1 | 7/2007 | Crippa et al. | |
| 2008/0252342 A1 | 10/2008 | Haerle | |

(Continued)

*Primary Examiner* — Lincoln Donovan
*Assistant Examiner* — Metasebia Retebo
(74) *Attorney, Agent, or Firm* — Charles E. Bergere

(57) ABSTRACT

A charge pump includes a charge pump core circuit, a replica bias circuit, and a differential amplifier. The charge pump core circuit includes current source and sink circuits for charging and discharging an output node of the charge pump core circuit. The current source and current sink circuits are user programmable using bit signals to adjust a bandwidth and a phase margin of a phase-locked loop (PLL) that includes the charge pump. An impedance of the replica bias circuit varies based on the bit signals. The differential amplifier and the replica bias circuit form a feedback loop that reduces current mismatch between the current source and sink circuits.

14 Claims, 2 Drawing Sheets

(56) References Cited

U.S. PATENT DOCUMENTS

| | | |
|---|---|---|
| 2009/0121760 A1 | 5/2009 | Haerle |
| 2009/0201058 A2 | 8/2009 | Haerle |
| 2010/0066450 A1 | 3/2010 | Palmer et al. |
| 2010/0079127 A1 | 4/2010 | Grant |
| 2010/0122904 A1 | 5/2010 | Hassibi et al. |
| 2010/0127739 A1 | 5/2010 | Ebuchi et al. |
| 2010/0283535 A1 | 11/2010 | Li et al. |

* cited by examiner

PROGRAMMABLE CHARGE PUMP

BACKGROUND

The present invention generally relates to integrated circuits, and, more particularly, to a charge pump.

Charge pumps are used in integrated circuits (ICs) to provide operating supply voltages. Charge pumps also are used as current sources and current sinks to charge and discharge, respectively, internal nodes of ICs. In a typical application, a charge pump is used in a phase-locked loop (PLL) that includes a phase detector, a loop filter, and a voltage-controlled oscillator (VCO). The charge pump charges and discharges a capacitor of the loop filter to achieve a desired voltage on the capacitor based on up and down signals generated by the phase detector. The up and down signals indicate the phase difference between a reference clock signal and an output signal of the PLL generated by the VCO.

However, current mismatch between the charging and discharging currents leads to an offset between the reference clock signal and the PLL output signal, which impacts the performance of the IC. Further, the PLL bandwidth and the phase margin depend on the values of the charge pump current. Thus, to provide a large variation in the charge pump current, the charge pump needs to be programmable.

A known technique to reduce the mismatch between the charging and discharging currents is to include a replica bias circuit and a differential amplifier in the charge pump. The replica bias circuit and the differential amplifier ensure that the drain-to-source voltages of source transistors of the replica bias circuit are substantially equal to that of source transistors of the charge pump. The replica bias circuit and the differential amplifier also ensure that the drain-to-source voltages of sink transistors of the replica bias circuit are substantially equal to that of sink transistors of the charge pump. This reduces the mismatch between the charging and discharging currents. However, the charge pump still cannot provide a large variation in the charging and discharging currents, i.e., the charge pump does not enable the enhanced programmability of the charging and discharging currents.

A known technique to overcome the aforementioned problem is to include multiple source and sink transistors in the charge pump for charging and discharging the loop filter capacitor. The source and sink transistors can be switched on and off using external signals. However, in this technique, the current through the replica bias circuit does not change as desired, resulting in a voltage drop mismatch between the source transistors of the replica bias circuit and the source transistors of the charge pump core circuit, as well as a voltage drop mismatch between the sink transistors of the replica bias circuit and the sink transistors of the charge pump core circuit, which causes a mismatch between the two currents to resurface.

Another known technique to overcome the aforementioned problem is to use programmable transmission gates in the charge pump core circuit that connect the charge pump core circuit source and sink transistors, The transmission gates then are driven by the up and down signals and inverted up and down signals provided by the phase detector. This results in capacitive loading of the up and down and inverted up and down signals, which in turn results in additional channel charge injection and clock feed-through problems in the charge pump. This technique also causes a mismatch in charge pump input signals, i.e., the up and down signals and the inverted up and down signals.

It would be advantageous to have a programmable charge pump that can provide a large variation in the charging and discharging currents without causing a significant mismatch between the two.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
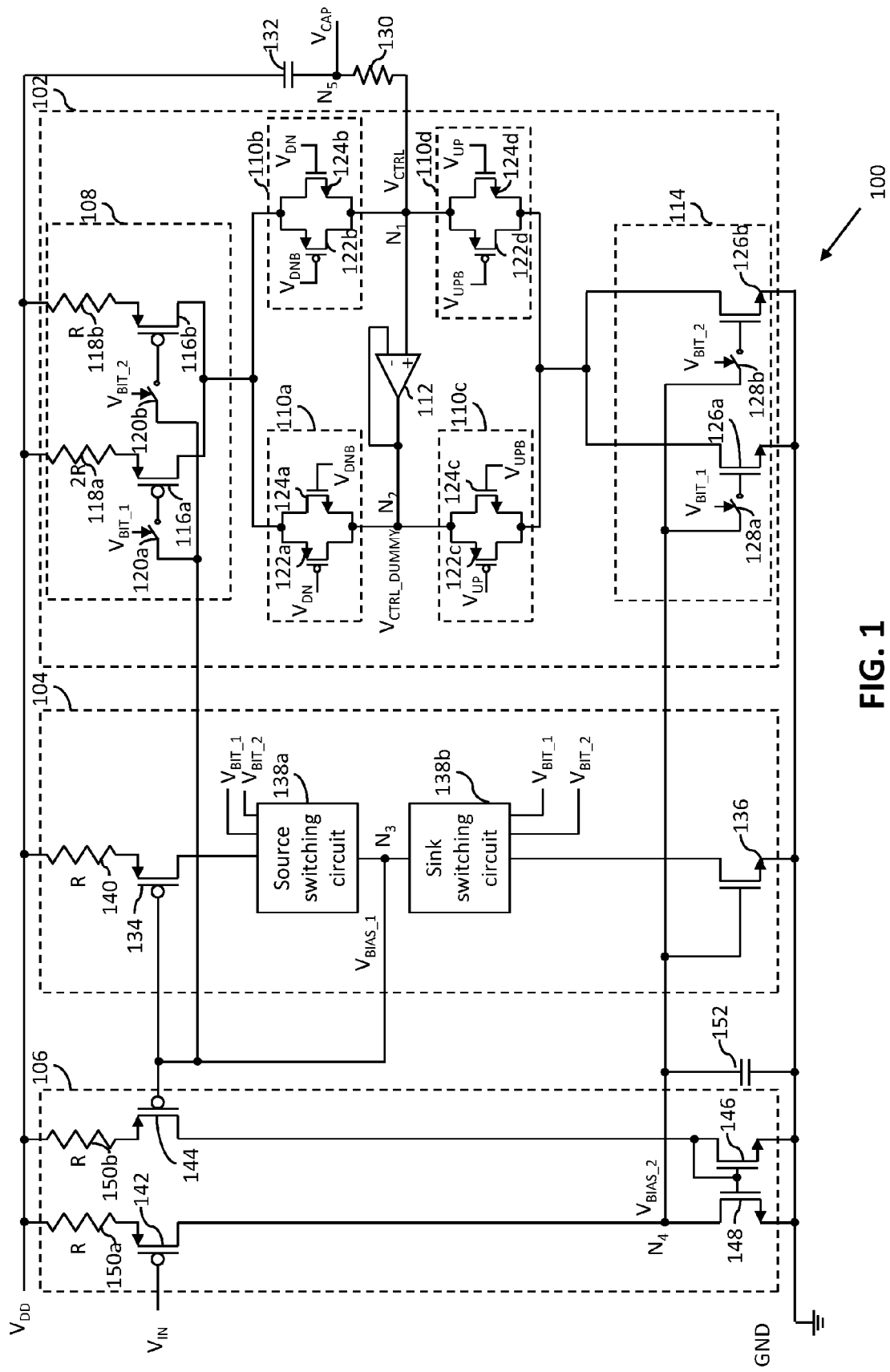
FIG. 1 is a schematic circuit diagram of a charge pump in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention is a charge pump. The charge pump includes a charge pump core circuit, a differential amplifier, and a replica bias circuit. The charge pump core circuit receives first and second control signals, first and second bias signals, and bit signals, and outputs a control voltage signal. The charge pump core circuit includes current source and current sink circuits. The current source circuit is connected between a supply voltage and an output node of the charge pump core circuit and provides a current to charge the output node based on the first control signal. The current output from the current source circuit varies based on the bit signals and the first bias signal. The current sink circuit is connected between the output node of the charge pump core circuit and ground, and discharges the output node based on the second control signal. The current drawn by the current sink circuit from the output node of the charge pump core circuit varies based on the bit signals and the second bias signal. The differential amplifier receives an input signal and the first bias signal and generates the second bias signal. The input signal is at least one of the control voltage signal and a filtered version of the control voltage signal. The replica bias circuit is connected between the differential amplifier and the charge pump core circuit, receives the bit signals and the second bias signal, and generates the first bias signal. The replica bias circuit reduces the difference between the first bias signal and the control voltage signal.

In another embodiment, the present invention is a charge pump that includes a charge pump core circuit, a differential amplifier, and a replica bias circuit. The charge pump core circuit receives first and second control signals, first and second bias signals, and bit signals, and outputs a control voltage signal at an output node. The charge pump core circuit includes current source and current sink circuits. The current source circuit is connected between a supply voltage and the output node and provides a current to charge the output node based on the first control signal. The current output from the current source circuit varies based on the bit signals and the first bias signal. The current sink circuit is connected between the output node of the charge pump core circuit and ground and discharges the output node based on the second control signal. The current drawn by the current sink circuit from the output node of the charge pump core circuit varies based on the bit signals and the second bias signal. The differential amplifier receives an input signal and the first bias signal and generates the second bias signal. The input signal is at least one of the control voltage signal and a filtered version of the control voltage signal. The replica bias circuit is connected between the differential amplifier and the charge pump core circuit and includes first and second transistors and source and sink switching circuits. The first transistor has a source connected to the supply voltage and a gate that receives the first bias signal. The second transistor has a source connected to ground, and a gate connected to the differential amplifier to receive the second bias signal. The source switching circuit is connected to a drain of the first transistor and receives the bit signals. The sink switching circuit is connected between the source switching circuit and a drain of the second transistor and receives the bit signals. Impedances of the source and sink switching circuits vary based on the bit signals. The first bias signal is output from a node between the source and sink switching circuits.

Various embodiments of the present invention provide a charge pump that includes a charge pump core circuit, a replica bias circuit, and a differential amplifier. The charge pump core circuit includes current source and sink circuits. The current source circuit provides a current for charging an output node of the charge pump core circuit based on a first bias signal when a first control signal is active. The current sink circuit draws a current from the output node of the charge pump core circuit for discharging the output node based on a second bias signal when a second control signal is active. The current source and current sink circuits can be programmed by a user by using the bit signals to adjust the bandwidth and phase margin of a phase-locked loop (PLL) that includes the charge pump. The differential amplifier receives an input signal and the first bias signal and generates the second bias signal. The input signal is at least one of a control voltage signal, which is output by the charge pump core circuit at its output node, and a filtered version of the control voltage signal. The replica bias circuit receives the second bias signal and the bit signals, and outputs the first bias signal. Based on the bit signals, the impedance of source and sink switching circuits of the replica bias circuit vary such that the mismatch between the current output from the current source circuit and the current drawn by the current sink circuit is reduced.

Referring now to FIG. 1, a schematic circuit diagram of a charge pump 100 in accordance with an embodiment of the present invention is shown. The charge pump 100 includes a charge pump core circuit 102, a replica bias circuit 104, and a differential amplifier 106. The charge pump core circuit 102 includes a current source circuit 108, first through fourth transmission gates 110a-110d, a unity gain amplifier 112, and a current sink circuit 114.

The current source circuit 108 includes transistors 116, two of which are shown—first and second transistors 116a and 116b. The current source circuit 108 also includes a resistor 118 and a switch 120 for each transistor 116. In one embodiment, the transistors 116 are p-channel metal-oxide semiconductor (PMOS) transistors.

Source terminals of the first and second transistors 116a and 116b are connected to a supply voltage ($V_{DD}$) by way of first and second resistors 118a and 118b, respectively. Gate terminals of the first and second transistors 116a and 116b receive a first bias signal ($V_{BIAS\_1}$) by way of first and second switches 120a and 120b, respectively. Drain terminals of the first and second transistors 116a and 116b are connected together and generate a current. The first switch 120a is controlled by a first bit signal ($V_{BIT\_1}$) and is in a closed position when the first bit signal ($V_{BIT\_1}$) is active. The second switch 120b is controlled by a second bit signal ($V_{BIT\_2}$) and is in the closed position when the second bit signal ($V_{BIT\_2}$) is active. The first and second bit signals ($V_{BIT\_1}$ and $V_{BIT\_2}$) are collectively referred to as the bit signals ($V_{BITS}$).

Each transmission gate 110 includes two transistors 122 and 124, i.e., the first through fourth transmission gates 110a-110d include third through sixth transistors 122a-122d and seventh through tenth transistors 124a-124d, respectively. In one embodiment, the transistors 122 are PMOS transistors, and the transistors 124 are n-channel MOS (NMOS) transistors.

A source terminal of the third transistor 122a is connected to a drain terminal of the seventh transistor 124a, and a drain terminal of the third transistor 122a is connected to a source terminal of the seventh transistor 124a. Gate terminals of the third and seventh transistors 122a and 124a receive a first control signal ($V_{DN}$) and an inverted version of the first control signal ($V_{DNB}$) (hereinafter referred to as the inverted first control signal ($V_{DNB}$)), respectively. Thus, the first transmission gate 110a is controlled by the first control signal ($V_{DN}$) and is active when the first control signal ($V_{DN}$) is inactive. The second through fourth transmission gates 110b-110d are structurally and functionally similar to the first transmission gate 110a.

The first transmission gate 110a is connected to the third transmission gate 110c and their combination (also referred to as the first circuit branch) is connected between the current source and current sink circuits 108 and 114. The second transmission gate 110b is connected to the fourth transmission gate 110d and their combination (also referred to as the second circuit branch) is connected between the current source and current sink circuits 108 and 114.

The second transmission gate 110b is controlled by the first control signal ($V_{DN}$) and is active when the first control signal ($V_{DN}$) is active. The third transmission gate 110c is controlled by a second control signal ($V_{UP}$) and is active when the second control signal ($V_{UP}$) is inactive. The fourth transmission gate 110d also is controlled by the second control signal ($V_{UP}$) and is active when the second control signal ($V_{UP}$) is active.

The current sink circuit 114 includes transistors 126, two of which are shown—eleventh and twelfth transistors 126a and 126b. The current sink circuit 114 also includes a switch 128 for each transistor 126.

Source terminals of the eleventh and twelfth transistors 126a and 126b are connected to ground. Gate terminals of the eleventh and twelfth transistors 126a and 126b receive a second bias signal ($V_{BIAS\_2}$) by way of third and fourth switches 128a and 128b, respectively. A drain terminal of each of the eleventh and twelfth transistors 126a and 126b is connected to the third and fourth transmission gates 110c and 110d. The third switch 128a is controlled by the first bit signal ($V_{BIT\_1}$) and is in the closed position when the first bit signal ($V_{BIT\_1}$) is active. The fourth switch 128b is controlled by the second bit signal ($V_{BIT\_2}$) and is in the closed position when the second bit signal ($V_{BIT\_2}$) is active.

Thus, the current source circuit 108 provides a current to charge a first node (N1) when the first control signal ($V_{DN}$)

is active, and the current sink circuit 114 draws a current from the first node (N1) when the second control signal ($V_{UP}$) is active, thereby discharging the first node (N1). The first node (N1) is an output node of the charge pump core circuit 102, and a control voltage signal ($V_{CTRL}$) is output from the first node (N1). Hereinafter, the current output from the current source circuit 108 will be referred to as the charging current, and the current drawn by the current sink circuit 114 from the first node (N1) will be referred to as the discharging current.

The unity gain amplifier 112 is connected between the first node (N1) and a second node (N2), which is formed by the connection of the first and third transmission gates 110a and 110c. A third resistor 130 and a first capacitor 132 are connected in series between the first node (N1) and the supply voltage ($V_{DD}$) and form a low-pass filter. The unity gain amplifier 112 reduces the charge sharing between the first node (N1) and the parasitic capacitances of the current source and sink circuits 108 and 114 when the charge pump 100 switches between the charging and discharging operations.

The replica bias circuit 104 includes thirteenth and fourteenth transistors 134 and 136, a source switching circuit 138a, and a sink switching circuit 138b. In one embodiment, the thirteenth and fourteenth transistors 134 and 136 are PMOS and NMOS transistors, respectively.

A source terminal of the thirteenth transistor 134 is connected to the supply voltage ($V_{DD}$) by way of a fourth resistor 140, and a source terminal of the fourteenth transistor 136 is connected to ground. Gate terminals of the thirteenth and fourteenth transistors 134 and 136 receive the first and second bias signals ($V_{BIAS\_1}$ and $V_{BIAS\_2}$), respectively.

The source and sink switching circuits 138a and 138b receive the first and second bit signals ($V_{BIT\_1}$ and $V_{BIT\_2}$) and are connected in series with each other. The series combination of the source and sink switching circuits 138a and 138b is connected between drain terminals of the thirteenth and fourteenth transistors 134 and 136. The first bias signal ($V_{BIAS\_1}$) is output from a third node (N3) between the source and sink switching circuits 138a and 138b. In the presently preferred embodiment, the sink switching circuits 138b is structurally and functionally similar to the source switching circuit 138a, which will be explained in detail in conjunction with FIG. 2.

The differential amplifier 106 includes fifteenth through eighteenth transistors 142-148 and fifth and sixth resistors 150a and 150b. In one embodiment, the fifteenth and sixteenth transistors 142 and 144 are PMOS transistors, and seventeenth and eighteenth transistors 146 and 148 are NMOS transistors.

Source terminals of the fifteenth and sixteenth transistors 142 and 144 are connected to the supply voltage ($V_{DD}$) by way of the fifth and sixth resistors 150a and 150b, respectively. A gate terminal of the fifteenth transistor 142 receives an input signal ($V_{IN}$). A gate terminal of the sixteenth transistor 144 is connected to the third node (N3) and receives the first bias signal ($V_{BIAS\_1}$). Drain terminals of the seventeenth and eighteenth transistors 146 and 148 are connected to drain terminals of the sixteenth and fifteenth transistors 144 and 142, respectively. Gate terminals of the seventeenth and eighteenth transistors 146 and 148 are connected to the drain terminal of the seventeenth transistor 146. Source terminals of the seventeenth and eighteenth transistors 146 and 148 are connected to ground. The second bias signal ($V_{BIAS\_2}$) is output from a fourth node (N4) between the drain terminals of the fifteenth and eighteenth transistors 142 and 148. In one embodiment, the gate terminal of the fifteenth transistor 142 is connected to the first node (N1) and receives the control voltage signal ($V_{CTRL}$) as the input signal ($V_{IN}$). In another embodiment, the gate terminal of the fifteenth transistor 142 is connected to a fifth node (N5) between the third resistor 130 and the first capacitor 132 to receive a filtered version of the control voltage signal ($V_{CAP}$) (hereinafter referred to as the filtered control voltage signal ($V_{CAP}$)) as the input signal ($V_{IN}$). In one embodiment, a second capacitor 152 is connected between the node (N4) and ground to reduce ripples in the second bias signal ($V_{BIAS\_2}$).

Figure 2:
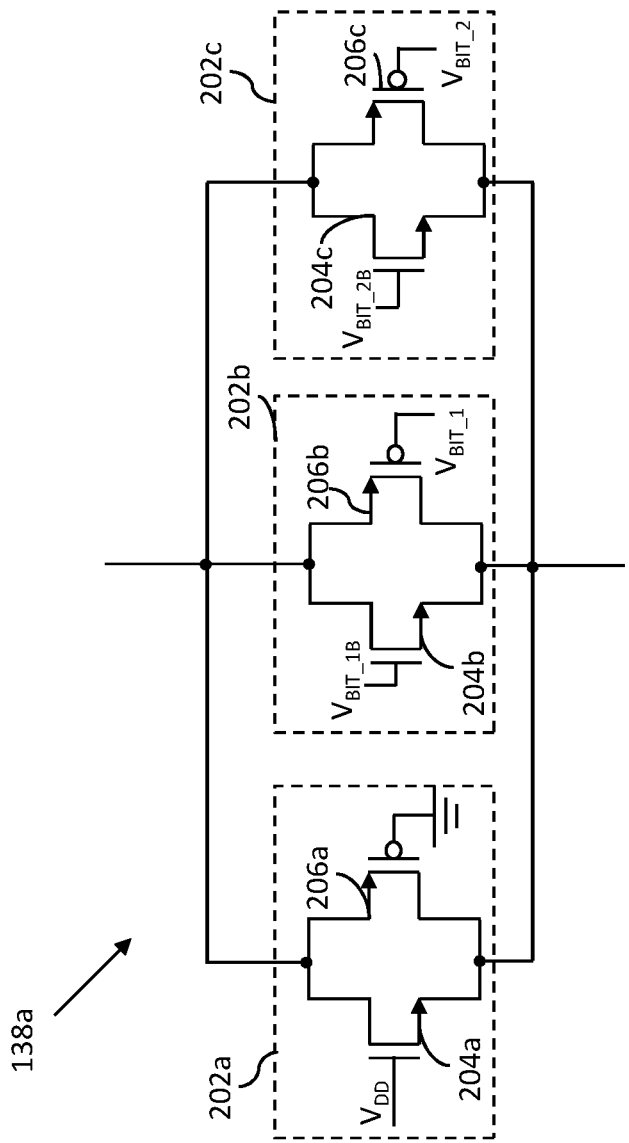
FIG. 2 is a schematic circuit diagram of a source switching circuit of the charge pump of FIG. 1 in accordance with an embodiment of the present invention.

Referring now to FIG. 2, a schematic circuit diagram of the source switching circuit 138a in accordance with an embodiment of the present invention is shown. The source switching circuit 138a includes transmission gates 202, three of which are shown—fifth through seventh transmission gates 202a-202c. Each transmission gate 202 includes two transistors 204 and 206, i.e., the fifth through seventh transmission gates 202a-202c include nineteenth through twenty-first transistors 204a-204c and twenty-second through twenty-fourth transistors 206a-206c, respectively. In one embodiment, the transistors 204 are NMOS transistors, and the transistors 206 are PMOS transistors. The transmission gates 202 are structurally and functionally similar to the transmission gates 110.

The fifth through seventh transmission gates 202a-202c are connected in parallel with each other. The fifth transmission gate 202a is always active as a gate terminal of the nineteenth transistor 204a receives the supply voltage ($V_{DD}$), and a gate terminal of the twenty-second transistor 206a is connected to ground.

The sixth transmission gate 202b is controlled by the first bit signal ($V_{BIT\_1}$) and is active when the first bit signal ($V_{BIT\_1}$) is inactive. The seventh transmission gate 202c is controlled by the second bit signal ($V_{BIT\_2}$) and is active when the second bit signal ($V_{BIT\_2}$) is inactive.

In one example, the first control signal ($V_{DN}$) is active and the filtered control voltage signal ($V_{CAP}$) is the input signal ($V_{IN}$). Since the first control signal ($V_{DN}$) is active, a voltage level of the control voltage signal ($V_{CTRL}$) (and hence of the filtered control voltage signal ($V_{CAP}$)) increases due to charging of the first node (N1), thereby decreasing a voltage level of the second bias signal ($V_{BIAS\_2}$). This in turn decreases the current through the replica bias circuit 104. Thus, a voltage level of the first bias signal ($V_{BIAS\_1}$), which is also an input to the differential amplifier 106, increases, and hence, the difference between the two inputs to the differential amplifier 106 decreases, thereby decreasing the voltage level of the second bias signal ($V_{BIAS\_2}$). This process continues till the first bias signal ($V_{BIAS\_1}$) achieves a value that is substantially equal to the filtered control voltage signal ($V_{CAP}$).

The current source and current sink circuits 108 and 114 can be programmed by a user by using the bit signals ($V_{BITS}$) to adjust the bandwidth and the phase margin of a PLL (not shown) that includes the charge pump 100. Based on the bit signals ($V_{BITS}$), the impedance of source switching circuit 138a varies such that the voltage drop across the source switching circuit 138a is substantially equal to the voltage drop across each of the first and second transmission gates 110a and 110b, and the impedance of sink switching circuit 138b varies such that the voltage drop across the sink switching circuit 138b is substantially equal to the voltage drop across each of the third and fourth transmission gates 110c and 110d. This ensures that the voltage drop across the combination of the thirteenth transistor 134 and the fourth resistor 140 is substantially equal to the voltage drop across the current source circuit 108, and the voltage drop across the fourteenth transistor 136 is substantially equal to the voltage drop across the current sink circuit 114 across process-voltage-temperature (PVT) corners. Thus, the replica bias circuit 104 minimizes the mismatch between the current output from the current source circuit 108 and the current drawn by the current sink circuit 114 from the first node (N1).

Thus, instead of making the first and second circuit branches programmable by including an additional number of transmission gates 110 in parallel with the first and second transmission gates 110a and 110b controlled by the first control signal ($V_{DN}$) and the inverted first control signal ($V_{DNB}$), and including an additional number of transmission gates 110 in parallel with the third and fourth transmission gates 110c and 110d controlled by the second control signal ($V_{UP}$) and an inverted version of the second control signal ($V_{UPB}$) (hereinafter referred to as the inverted second control signal ($V_{UPB}$)), the replica bias circuit 104 is made programmable by using programmable source and sink switching circuits 138a and 138b to minimize the current mismatch between the current source and current sink circuits 108 and 114. Further, the fixed number of transmission gates 110 (i.e., no programmability in the charge pump core circuit 102 using the transmission gates 110) ensures that the first and second control signals ($V_{DN}$ and $V_{UP}$) and the inverted first and second control signals ($V_{DNB}$ and $V_{UPB}$) are not significantly capacitively loaded. Moreover, the use of a fixed (or minimum) number of transmission gates 110 reduces the problem of channel charge injection and clock feed-through.

In one embodiment, the size of the transistors 116, the transistors 126, and the resistances of the resistors 118 are binary-weighted. In one example, the size of the first transistor 116a is 'S', and the size of the second transistor 116b is '2*S'. The size of the eleventh transistor 126a is 'S', and the size of the twelfth transistor 126b is '2*S'. The resistance of the first resistor 118a is '2*R', and the resistance of the second resistor 118b is 'R'. The size of the twentieth transistor 204b is 'S', and the size of the twenty-first transistor 204c is '2*S'. The size of the twenty-third transistor 206b is 'S' and the size of the twenty-fourth transistor 206c is '2*S'. The size of the fifth transmission gate 202a depends on the number of the bit signals ($V_{BITS}$) and ensures that the difference between the voltage drop across the source switching circuit 138a and the voltage drop across the first transmission gate 110a (which is equal to the voltage drop across the second transmission gate 110b) is minimized for all values of the bit signals ($V_{BITS}$). Similarly, one transmission gate (not shown) in the sink switching circuit 138b is always on and its size depends on the number of the bit signals ($V_{BITS}$) and ensures that the difference between the voltage drop across the sink switching circuit 138b and the voltage drop across the third transmission gates 110c (which is equal to the voltage drop across the fourth transmission gate 110d) is reduced for all the values of the bit signals ($V_{BITS}$). Further, the bit signals ($V_{BITS}$) may be output from a register (not shown) that includes a value provided by the user. In one embodiment, the first bit signal ($V_{BIT\_1}$) is the least significant bit (LSB) of the register value, and the second bit signal ($V_{BIT\_2}$) is the second LSB of the register value.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A programmable charge pump, comprising:
    a charge pump core circuit that receives first and second control signals, first and second bias signals, and a plurality of bit signals, and outputs a control voltage signal at an output node thereof, the charge pump core circuit comprising:
        a current source circuit, connected between a supply voltage and the output node of the charge pump core circuit, that charges the output node of the charge pump core circuit based on the first control signal, wherein a current output from the current source circuit varies based on the plurality of bit signals and the first bias signal; and
        a current sink circuit, connected between the output node of the charge pump core circuit and ground, that discharges the output node of the charge pump core circuit based on the second control signal, wherein a current drawn by the current sink circuit from the output node of the charge pump core circuit varies based on the plurality of bit signals and the second bias signal,
        a source transmission gate that connects the current source to the output node of the charge pump circuit and a sink transmission gate that connects the sink circuit to the output node of the charge pump core circuit, wherein the source and sink transmission gates are controlled by the first and second control signals, respectively;
    a differential amplifier that receives an input signal and the first bias signal, and generates the second bias signal, wherein the input signal is at least one of the control voltage signal and a filtered version of the control voltage signal; and
    a replica bias circuit, connected between the differential amplifier and the charge pump core circuit, that receives the plurality of bit signals and the second bias signal and generates the first bias signal, wherein the replica bias circuit reduces a difference between the first bias signal and the control voltage signal.

2. The programmable charge pump of claim 1, wherein the current source circuit comprises:
    a first transistor having a source connected to the supply voltage and a gate connected to the replica bias circuit by way of a first switch for receiving the first bias signal, wherein the first switch is controlled by a first bit signal of the plurality of bit signals; and
    a second transistor having a source connected to the supply voltage, a gate connected to the replica bias circuit by way of a second switch for receiving the first bias signal, and a drain connected to a drain of the first transistor, wherein the second switch is controlled by a second bit signal of the plurality of bit signals.

3. The programmable charge pump of claim 1, wherein the current sink circuit comprises:
    a first transistor having a source connected to ground and a gate connected to the differential amplifier by way of a first switch for receiving the second bias signal, wherein the first switch is controlled by a first bit signal of the plurality of bit signals; and
    a second transistor having a source connected to ground, a gate connected to the differential amplifier by way of a second switch for receiving the second bias signal, and a drain connected to a drain of the first transistor, wherein the second switch is controlled by a second bit signal of the plurality of bit signals.

4. The programmable charge pump of claim 1, wherein the replica bias circuit comprises:
a first transistor having a source connected to the supply voltage and a gate that receives the first bias signal;
a second transistor having a source connected to ground and a gate connected to the differential amplifier for receiving the second bias signal;
a source switching circuit connected to a drain of the first transistor and receives the plurality of bit signals, wherein an impedance of the source switching circuit varies based on the plurality of bit signals; and
a sink switching circuit connected between the source switching circuit and a drain of the second transistor and receives the plurality of bit signals, wherein an impedance of the sink switching circuit varies based on the plurality of bit signals, and wherein the first bias signal is output from a node between the source and sink switching circuits.

5. The programmable charge pump of claim 4, wherein the source switching circuit comprises first through third transmission gates connected between the drain of the first transistor and the sink switching circuit, and wherein the first transmission gate is active, and the second and third transmission gates are controlled by first and second bit signals of the plurality of bit signals, respectively.

6. The programmable charge pump of claim 4, wherein the sink switching circuit comprises first through third transmission gates connected between the source switching circuit and the drain of the second transistor, and wherein the first transmission gate is active, and the second and third transmission gates are controlled by first and second bit signals of the plurality of bit signals, respectively.

7. The programmable charge pump of claim 1, wherein the differential amplifier comprises:
a first transistor having a source connected to the supply voltage and a gate that receives the input signal;
a second transistor having a source connected to the supply voltage and a gate connected to the replica bias circuit for receiving the first bias signal;
a third transistor having a source connected to ground, a drain connected to a drain of the second transistor, and a gate connected to its drain; and
a fourth transistor having a source connected to ground, a gate connected to the gate of the third transistor, and a drain connected to a drain of the first transistor for outputting the second bias signal.

8. A programmable charge pump, comprising:
a charge pump core circuit that receives first and second control signals, first and second bias signals, and a plurality of bit signals, and outputs a control voltage signal at an output node thereof, the charge pump core circuit comprising:
a current source circuit, connected between a supply voltage and the output node of the charge pump core circuit, that charges the output node of the charge pump core circuit based on the first control signal, wherein a current output from the current source circuit varies based on the plurality of bit signals and the first bias signal; and
a current sink circuit, connected between the output node of the charge pump core circuit and ground, that discharges the output node of the charge pump core circuit based on the second control signal, wherein a current drawn by the current sink circuit from the output node of the charge pump core circuit varies based on the plurality of bit signals and the second bias signal;
a differential amplifier that receives an input signal and the first bias signal, and generates the second bias signal, wherein the input signal is at least one of the control voltage signal and a filtered version of the control voltage signal; and
a replica bias circuit connected between the differential amplifier and the charge pump core circuit, the replica bias circuit comprising:
a first transistor having a source connected to the supply voltage and a gate that receives the first bias signal;
a second transistor having a source connected to ground and a gate connected to the differential amplifier for receiving the second bias signal;
a source switching circuit that is connected to a drain of the first transistor and receives the plurality of bit signals, wherein an impedance of the source switching circuit varies based on the plurality of bit signals; and
a sink switching circuit connected between the source switching circuit and a drain of the second transistor and receives the plurality of bit signals, wherein an impedance of the sink switching circuit varies based on the plurality of bit signals, and wherein the first bias signal is output from a node between the source and sink switching circuits.

9. The programmable charge pump of claim 8, wherein the current source circuit comprises:
a third transistor having a source connected to the supply voltage and a gate connected to the replica bias circuit by way of a first switch for receiving the first bias signal, wherein the first switch is controlled by a first bit signal of the plurality of bit signals; and
a fourth transistor having a source connected to the supply voltage, a gate connected to the replica bias circuit by way of a second switch for receiving the first bias signal, and a drain connected to a drain of the third transistor, wherein the second switch is controlled by a second bit signal of the plurality of bit signals.

10. The programmable charge pump of claim 8, wherein the current sink circuit comprises:
a third transistor having a source connected to ground and a gate connected to the differential amplifier by way of a first switch for receiving the second bias signal, wherein the first switch is controlled by a first bit signal of the plurality of bit signals; and
a fourth transistor having a source connected to ground, a gate connected to the differential amplifier by way of a second switch for receiving the second bias signal, and a drain connected to a drain of the third transistor, wherein the second switch is controlled by a second bit signal of the plurality of bit signals.

11. The programmable charge pump of claim 8, wherein the source switching circuit comprises first through third transmission gates connected between the drain of the first transistor and the sink switching circuit, and wherein the first transmission gate is active, and the second and third transmission gates are controlled by first and second bit signals of the plurality of bit signals, respectively.

12. The programmable charge pump of claim 8, wherein the sink switching circuit comprises first through third transmission gates connected between the source switching circuit and the drain of the second transistor, and wherein the first transmission gate is active, and the second and third transmission gates are controlled by first and second bit signals of the plurality of bit signals, respectively.

13. The programmable charge pump of claim 8, wherein the differential amplifier comprises:
- a third transistor having a source connected to the supply voltage and a gate that receives the input signal;
- a fourth transistor having a source connected to the supply voltage and a gate connected to the replica bias circuit for receiving the first bias signal;
- a fifth transistor having a source connected to ground, a drain connected to a drain of the fourth transistor, and a gate connected to its drain; and
- a sixth transistor having a source connected to ground, a gate connected to the gate of the fifth transistor, and a drain connected to a drain of the third transistor for outputting the second bias signal.

14. The programmable charge pump of claim 8, wherein the current source and sink circuits are connected to the output node of the charge pump core circuit by way of first and second transmission gates, respectively, and wherein the first and second transmission gates are controlled by the first and second control signals, respectively.

\* \* \* \* \*